United States Patent [19]
Kardontchik

[11] Patent Number: 5,768,700
[45] Date of Patent: Jun. 16, 1998

[54] HIGH CONVERSION GAIN CMOS MIXER

[75] Inventor: Jaime E. Kardontchik, Sunnyvale, Calif.

[73] Assignee: Advanced Micro Devices, Inc., Sunnyvale, Calif.

[21] Appl. No.: 615,734

[22] Filed: Mar. 14, 1996

[51] Int. Cl.$^6$ .................................................. H04B 1/28
[52] U.S. Cl. ...................... 455/333; 330/254; 455/293
[58] Field of Search ............................... 455/333, 326, 455/293, 341; 327/356–359; 330/311, 254

[56] References Cited

U.S. PATENT DOCUMENTS

| | | | |
|---|---|---|---|
| 4,823,092 | 4/1989 | Pennock | 330/311 X |
| 5,281,924 | 1/1994 | Maloberti et al. | 330/253 |
| 5,389,840 | 2/1995 | Dow | 327/357 |
| 5,493,205 | 2/1996 | Gorecki | 330/257 X |
| 5,572,166 | 11/1996 | Gilbert | 330/254 |

FOREIGN PATENT DOCUMENTS

| | | |
|---|---|---|
| 0 371 447 | 6/1990 | European Pat. Off. . |
| 0 395 894 | 11/1990 | European Pat. Off. . |
| 0 565 299 | 10/1993 | European Pat. Off. . |

OTHER PUBLICATIONS

"Analysis and Design of Analog Integrated Circuits" (Third Edition), Authors: Paul R. Gray, Robert G. Meyer, Chapter 6, pp. 464–466, Fig. 6.42, John Wiley & Sons, Inc. Publishers, 1993.

"RF Circuits For Communication Applications", Authors: Steve Andrezyk and Raphael Matarazzo, RF Integrated Circuits, No. 1, Atlanta, U.S., pp. 74–80, Jan. 1996, XP000557688.

"Introduction to the Design of Transconductor–Capacitor Filters" Author: Jaime E. Kardontchik; Chapter 8, pp. 79–106, Kluwer Academic Publishers, 1992.

"Low–Voltage CMOS Operational Amplifiers" Authors: Satoshi, Mohammed Ismail; Chapter 6, pp. 71–86, Kluwer Academic Publishers, 1995.

"A 1.5 GHz Highly Linear CMOS Downconversion Mixer" Authors: Jan Crols, IEEE and Michel S.J. Steyaert; IEEE Journal of Solid–State Circuits, vol. 30, No. 7, pp. 736–742, Jul. 1995.

"A ±5-V CMOS Analog Multiplier" Authors: Shi–Cai Qin, Randy L. Geiger, IEEE Journal of Solid–State Circuits, vol. SC–22, No. 6, pp. 1143–1146, Dec. 1987.

Primary Examiner—Thomas Mullen
Attorney, Agent, or Firm—Fliesler, Dubb, Meyer & Lovejoy LLP

[57] ABSTRACT

A mixer contains a multiplier circuit that includes MOS transistors configured as a Gilbert multiplier cell without gain resistors such that a first and a second node are directly coupled to a folded cascode output stage. The mixer receives a differential radio frequency (RF) signal and a differential local oscillator (LO) signal, and it generates, at the first and second nodes, a differential intermediate frequency (IF) signal. The mixer further includes output and gain/filter stages coupled to the multiplier circuit. The output stage exhibits a low input impedance and a high output impedance, and it generates an output stage differential current approximately equal to the differential current of the IF differential signal. The gain/filter stage both controls conversion gain of the mixer, and it filters the high frequency components generated by said multiplier circuit. A capacitor, implemented as the gain/filter stage, and a folded-cascode circuit for the output stage are disclosed.

19 Claims, 9 Drawing Sheets

HIGH CONVERSION GAIN CMOS MIXER

BACKGROUND OF THE INVENTION

1. Field of the Invention

The present invention is directed toward the field of mixers, and more particularly to a CMOS downconverter mixer with high gain.

2. Art Background

Analog multipliers or mixers are used in a wide range of communications applications. For example, analog multipliers are typically used as down converters in radio frequency (RF) receivers. In RF receivers, the analog multipliers convert a high frequency or radio frequency (RF) input signal to an intermediate frequency (IF) signal or to a base band signal. To perform the down conversion, the analog multiplier receives the carrier RF input signal as well as a mixing frequency from a local oscillator (LO). The desired output signal from the down converter mixer, entitled the intermediate frequency (IF) signal, is the difference between the RF input signal and the mixing LO signal (e.g. RF−LO). In addition, other signals, including a signal at a center frequency of (RF+LO) as well as harmonics of these fundamental frequencies, are generated. For the downconverter application, the frequency generated at (RF+LO) has the greatest amplitude of the undesired signals.

Analog multipliers or mixers may be implemented using only metal oxide semiconduct or (MOS) transistors. In the prior art, the MOS mixers are implemented either as a direct translation of a bipolar Gilbert mixer or as a non-Gilbert cell mixer. FIG. 1 illustrates a prior art Gilbert cell multiplier circuit. As shown in FIG. 1, the circuit receives a differential voltage, $V_x$, as the radio frequency (RF) input signal, and a differential voltage, $V_y$, as the local oscillator (LO) signal. The differential output voltage, $V_o$, is shown at the top portion of the circuit. The Gilbert cell multiplier circuit includes a plurality of n-channel metal oxide semiconductor (NMOS) transistors, labeled 100, 102, 104, 106, 108, and 110 on FIG. 1.

The N- MOS transistors are biased to operate in the high gain saturation region. The positive portion of the differential $V_x$ signal is applied to the gates of transistors 100 and 106, and the negative portion of $V_x$ is applied to the gates of transistors 102 and 104. The source of transistors 100 and 102 are coupled together as well as to the drain of transistor 108. Similarly, the sources of transistors 104 and 106 are coupled to the drain of transistor 110. The gate of transistor 108 is controlled by the positive portion of the differential $V_y$ signal, and the gate of transistor 110 is controlled by the negative portion of the differential $V_y$ signal. The sources of transistors 108 and 110 are coupled together to an ideal current source, labeled $I_{ss}$ on FIG. 1.

For the Gilbert cell multiplier shown in FIG. 1, the voltage conversion gain is given by the relationship:

$$V_o/V_x = R\sqrt{(2K_xK_y)}\ V_y$$

where $V_y$ is the amplitude of the LO signal, $V_x$ is the amplitude of the RF signal, $V_o$ is the amplitude of the IF output, and $K_x$ and $K_y$ are the transconductances of the RF and LO ports, respectively. The IF output, $V_o$, is derived through multiplication of the input $V_x$ and $V_y$ signals, and therefore the output $V_o$ contains both the difference frequency, (RF−LO), and the sum frequency, (RF+LO). For the Gilbert cell multiplier, the conversion gain ($V_o/V_x$) is small due to the small achievable values of the transconductances $K_x$ and $K_y$. For a further discussion of CMOS mixers, see S. C. Qin and R. L. Geiger "A+/−5 V CMOS Analog Multiplier" IEEE Journal of Solid-State Circuits, Vol. 22, 1143, Dec. 1987, B. Song "CMOS RF Circuits for Data Communications Applications" IEEE JSSC, Vol. 21, 310, April, 1986, and J. Crols and S. J. Steyaert "A 1.5 GHz Highly Linear CMOS Downconversion Mixer", IEEE JSSC, Vol. 30, 736, July 1995.

As shown in FIG. 1, the Gilbert cell multiplier further includes gain resistors $R_1$ and $R_2$, that couple the drains of transistors 100, 102, 104 and 106 to the supply voltage, AVdd. Resistors $R_1$ and $R_2$ have the same value, (i.e. R1=R2). The conversion gain of the multiplier is increased as the value of resistors $R_1$ and $R_2$ are increased. However, the value of the resistors $R_1$ and $R_2$ cannot merely be increased to any value because an increase in the $R_1$ and $R_2$ resistances causes a significant DC voltage drop at the top of the cell. Consequently, if only a small voltage remains at the drain of transistors 100, 102, 104 and 106, then there is no room for required voltage drops at the core of the multiplier circuit.

Downconverters have application for use in portable devices, such as cellular telephones and wireless modems. For these portable downconverter applications, the power supply is typically set at approximately 2.7 volts to 3 volts. At these power supply voltages, the drop in voltage due to a large resistive value of $R_1$ and $R_2$ is unacceptable. For example, in a high speed MOS mixer application, the tail current, $I_{ss}$, equals approximately 1 milli ampere (mA). Thus, the DC voltage drop across one of the resistors set to 10 kilo ohms (k Ω) is approximately 5 volts (e.g. R×$I_{ss}$÷2). Because of this, the resistor values are typically restricted to about 1 kilo ohm (kΩ).

An additional weakness of the prior art CMOS Gilbert cell multiplier is that the voltage levels at the output of the cell are usually not appropriate for the next stage of the receiver. Typically, the quiescent output operating point (i.e. output voltage with no input signal) lies at approximately AVdd R*ISS/2. Thus, the output voltage is very close to the positive power supply voltage, AVdd. Voltage or source followers are used in prior art circuits to shift the output voltage toward the middle of the power supply voltage, AVdd/2, as well as to buffer the mixer output from the next stage of the receiver. However, the output voltage of voltage followers is not well defined in CMOS technology in that it depends on process parameters, temperature and power supply values. This variation typically degrades the performance of the CMOS circuit following the mixer.

In a non-Gilbert cell implementation (e.g., J. Crols et al) the switching transistors must be kept in the 'ohmic' or 'triode' region at all times. Hence, large gate voltages are usually needed for these transistors. This makes the design of this type of cell more difficult, because the overdrive voltage available to drive these switches is very limited, particularly true for lower power supply applications. In addition, the power dissipation of the LO driver is large, because it drives the small 'on' resistors of the switches. Thus, for the non-Gilbert cell multiplier, the design of the LO driver is more difficult, and it also increases the total power dissipation.

SUMMARY OF THE INVENTION

A mixer contains a multiplier circuit that includes a plurality of transistors configured to receive a differential radio frequency (RF) signal and a differential local oscillator (LO) signal. In turn, the mixer generates, at a first and second node, a differential intermediate frequency (IF) signal in accordance with mixing the RF signal and the LO signal. The mixer further includes an output stage and a gain/filter stage. The output stage, which receives the differential (IF) signal, exhibits a low input impedance and a high output impedance, and it generates an output stage differential current approximately equal to the differential current of the IF differential signal. The gain/filter stage both controls conversion gain of the mixer, and for downconverter applications, it filters the high frequency components generated by the multiplier circuit. In one embodiment, the gain/filter stage is implemented with a capacitor.

In one embodiment, the output stage circuit is implemented with a folded-cascode circuit. The folded-cascode circuit may include an active feedback circuit and a common mode voltage circuit. The common mode voltage circuit sets the output common mode voltage of the mixer at the middle of the power supply voltage, AVdd/2, or at a voltage that optimizes the performance of the receiver (e.g. the mixer and a subsequent stage). The mixer may further include an active feedback circuit or a triple-cascode current source to increase the output impedance of the mixer.

DETAILED DESCRIPTION OF THE PREFERRED EMBODIMENTS

Figure 2:
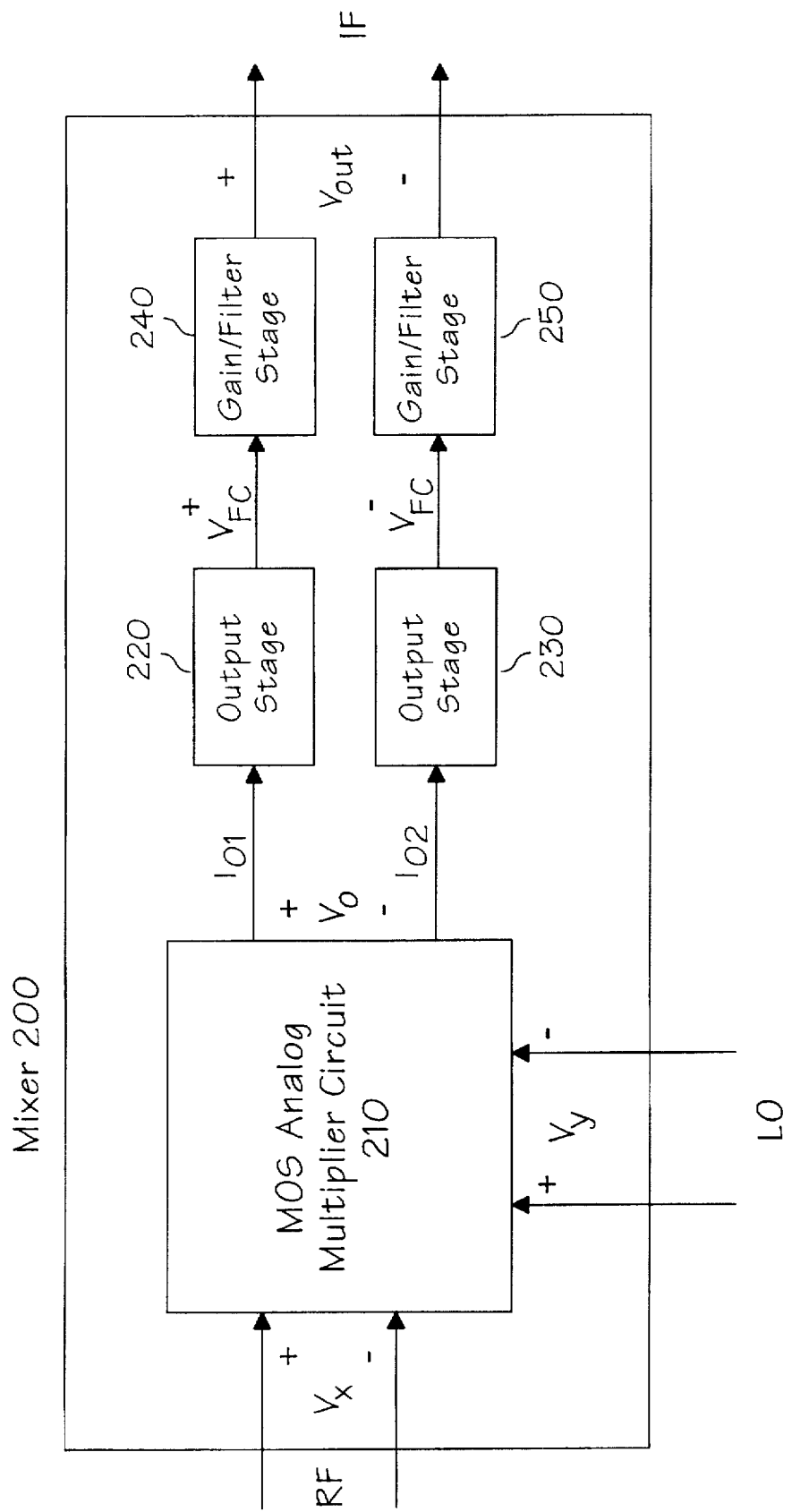
FIG. 2 is a block diagram illustrating one embodiment for the mixer of the present invention.

FIG. 2 is a block diagram illustrating one embodiment for a mixer. In one embodiment, the mixer 200 shown in FIG. 2 may be utilized as a down converter to convert high frequency or radio frequency (RF) input signals to intermediate frequency (IF) or base band signals. The mixer 200 includes a metal oxide semiconductor (MOS) analog multiplier circuit 210, output stages 220 and 230, and gain/filter stages 240 and 250. As shown in FIG. 2, the MOS analog multiplier circuit 210 receives a differential voltage, $V_x$, at the radio frequency (RF) port, and a differential voltage, $V_y$, at the local oscillator (LO) port. Also, as shown in FIG. 2, the mixer 200 generates, at the intermediate frequency (IF) port, a differential voltage, $V_{out}$. As described further below, an additional circuit that controls the common mode output voltage of the output stages may be used.

Figure 1:
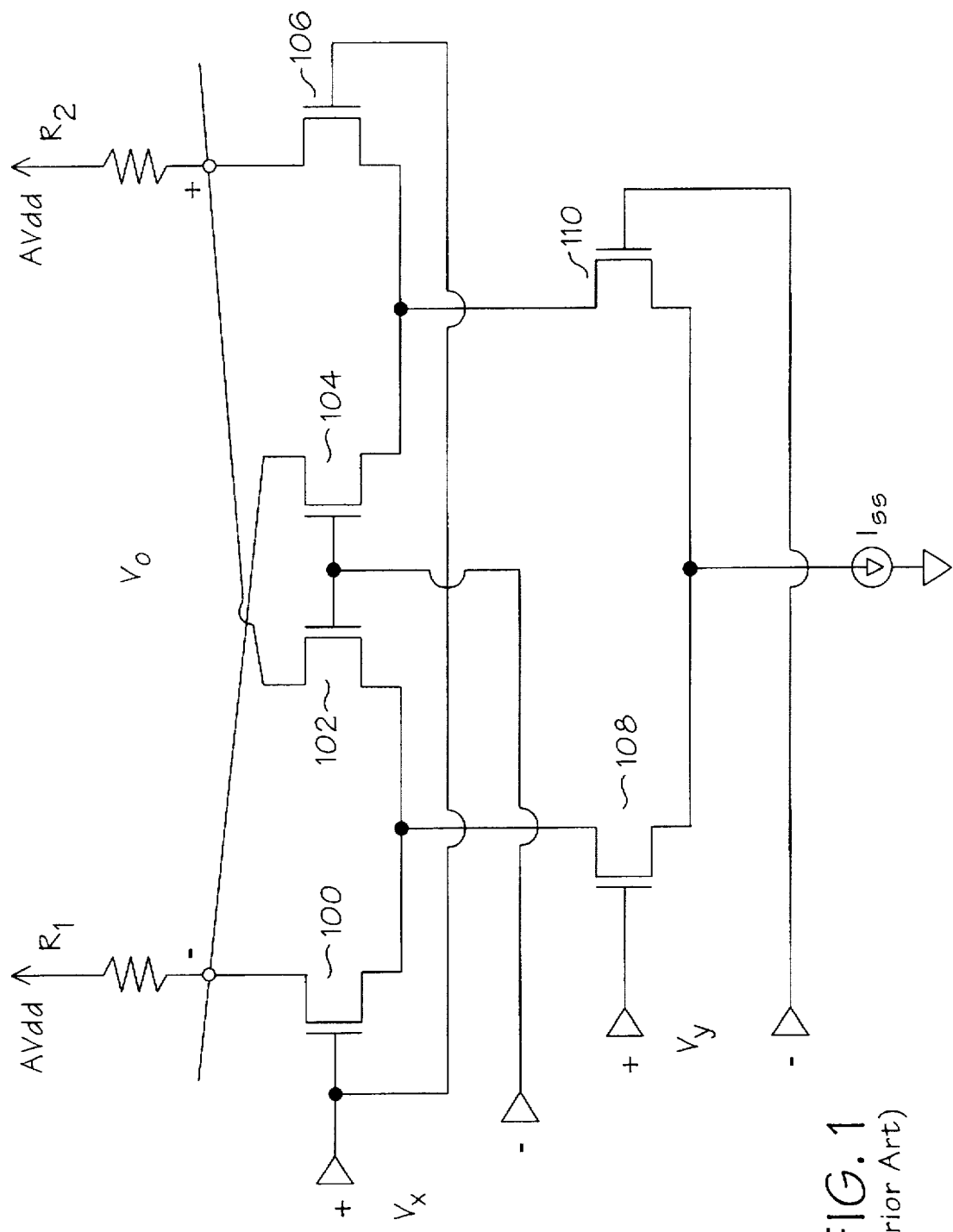
FIG. 1 illustrates a prior art Gilbert cell multiplier circuit.

In one embodiment, the MOS analog multiplier circuit 210 is a Gilbert cell multiplier circuit without gain resistors (e.g. no $R_1$ and $R_2$ resistors as shown in FIG. 1). The operation of the multiplier circuit 210 is described more fully below. In general, the MOS analog multiplier circuit 210 generates a differential current, labeled $I_{o1}$ and $I_{o2}$ on FIG. 2. The output stages 220 and 230 receive the $I_{o1}$ and $I_{o2}$ currents, respectively. In general, the output stages 220 and 230 maximize transfer of differential current, $I_{o1}$ and $I_{o2}$, to the gain/filter stages 240 and 250, respectively. One embodiment for the output stages 220 and 230 is described more fully below.

The gain/filter stages 240 and 250 receive, from the output stages 220 and 230, a differential signal, and they provide both gain and filtering. As is described more fully below, the gain generated from the gain/filter stages 240 and 250 does not adversely affect the operation of the MOS analog multiplier circuit 210. Thus, low operating voltages, such as 2.7 volts, may be used to power the mixer 200, (i.e., the dc voltage drop constraint of R*Idd/2 does not exist in the MOS Analog multiplier circuit 210). Also, for down converter applications, the gain/filter stages 240 and 250 filter high frequency components of the IF signal, including the RF+LO component. In one embodiment, the gain/filter stages 240 and 250 are implemented with a capacitor, wherein the capacitance value is optimized for gain and filtering characteristics for a given application.

Figure 3:
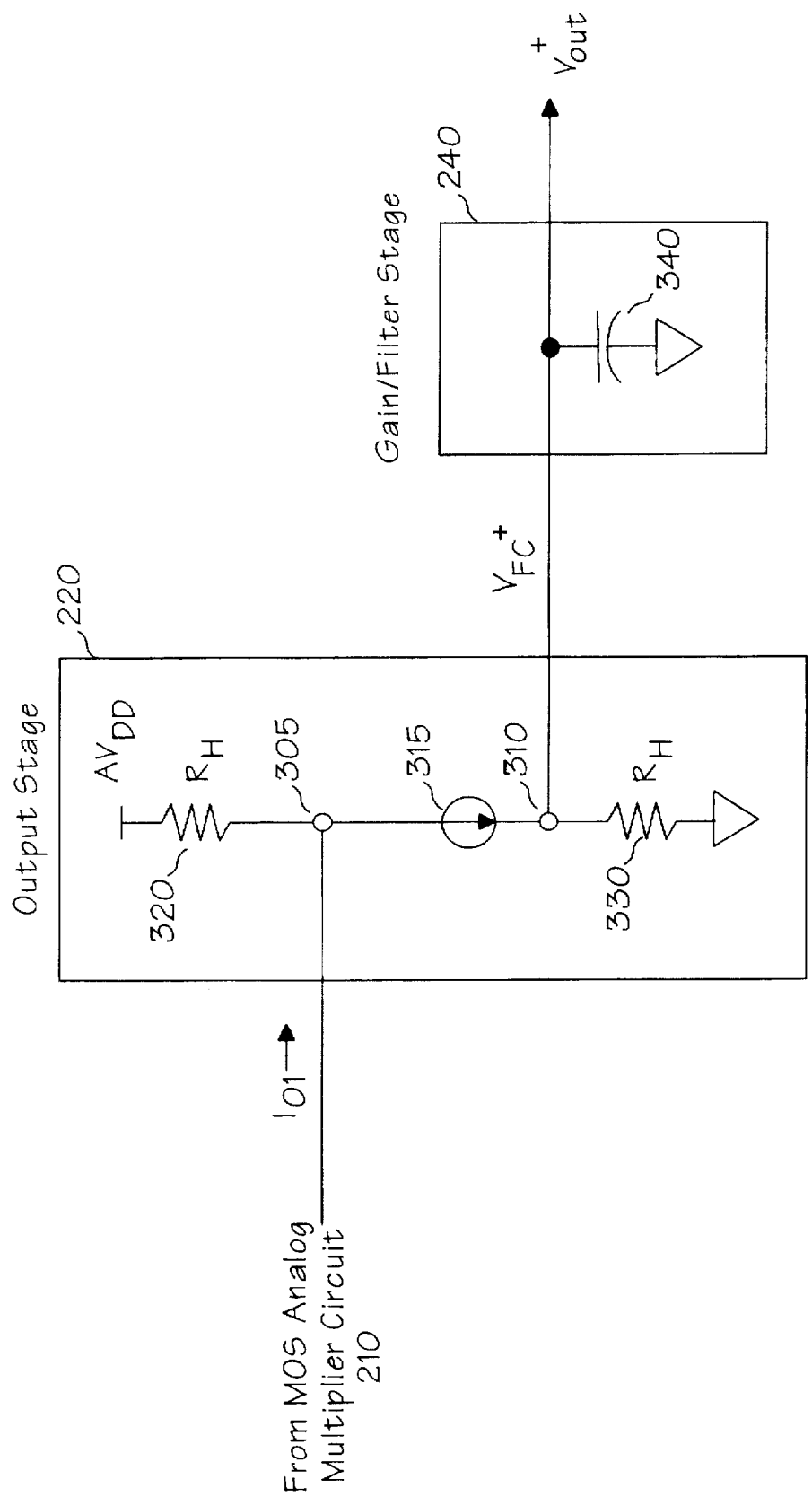
FIG. 3 is a single-ended equivalent circuit of a folded-cascode output.

In one embodiment, the output stages 220 and 230 are configured as folded-cascode (FC) output stages. In general, the folded-cascode output stage is a circuit element with the following properties: the current input to the FC circuit is equal to the output current of the FC circuit; the FC circuit has a very low input impedance (e.g. input impedance=1 over the transconductance of transistors 410 or 450 in FIG. 4); and the FC circuit has a very high output impedance. For practical purposes, the output impedance may be considered equal to infinity. FIG. 3 is a single-ended equivalent circuit of a folded-cascode output stage. For purposes of explanation, a single sided FC output stage 220 is shown in FIG. 3 that is driven by the $I_{o1}$ current. The operation of the FC output stage 230 driven by the $I_{o2}$ current is analogous to the operation of the FC output stage 220.

In operation, the MOS analog multiplier circuit 210 generates the $I_{o1}$ current at node 305. From the perspective of the current $I_{o1}$ flowing into node 305, the MOS analog multiplier circuit 210 has a high output impedance. The FC output stage circuit 220 includes, from the perspective of current $I_{o1}$ flowing into node 305, a high impedance coupled between node 305 and the power supply voltage, $AV_{DD}$. This is symbolically illustrated in FIG. 3 as resistor 320 with a resistance value of $R_H$, to represent the high impedance the current $I_{o1}$ sees between node 305 and the power supply $AV_{DD}$. The FC output stage circuit 220 further includes an effective current source, labeled 315 on FIG. 3, that flows from node 305 to a second node 310. Thus, when the current, $I_{o1}$, enters node 305, virtually all of the $I_{o1}$ current is directed downward towards node 310 (i.e. current $I_{o1}$ flows in the path of least resistance). At node 310, the FC output stage circuit 220 exhibits a high impedance coupled between node 310 and ground. This high impedance characteristic is symbolically represented by a resistor 330, which also has a high resistive value, $R_H$. Based on the high impedance 330, the $I_{o1}$ current, at node 310, is diverted to the output port, labeled $V_{FC}$ on FIG. 3.

Figure 6:
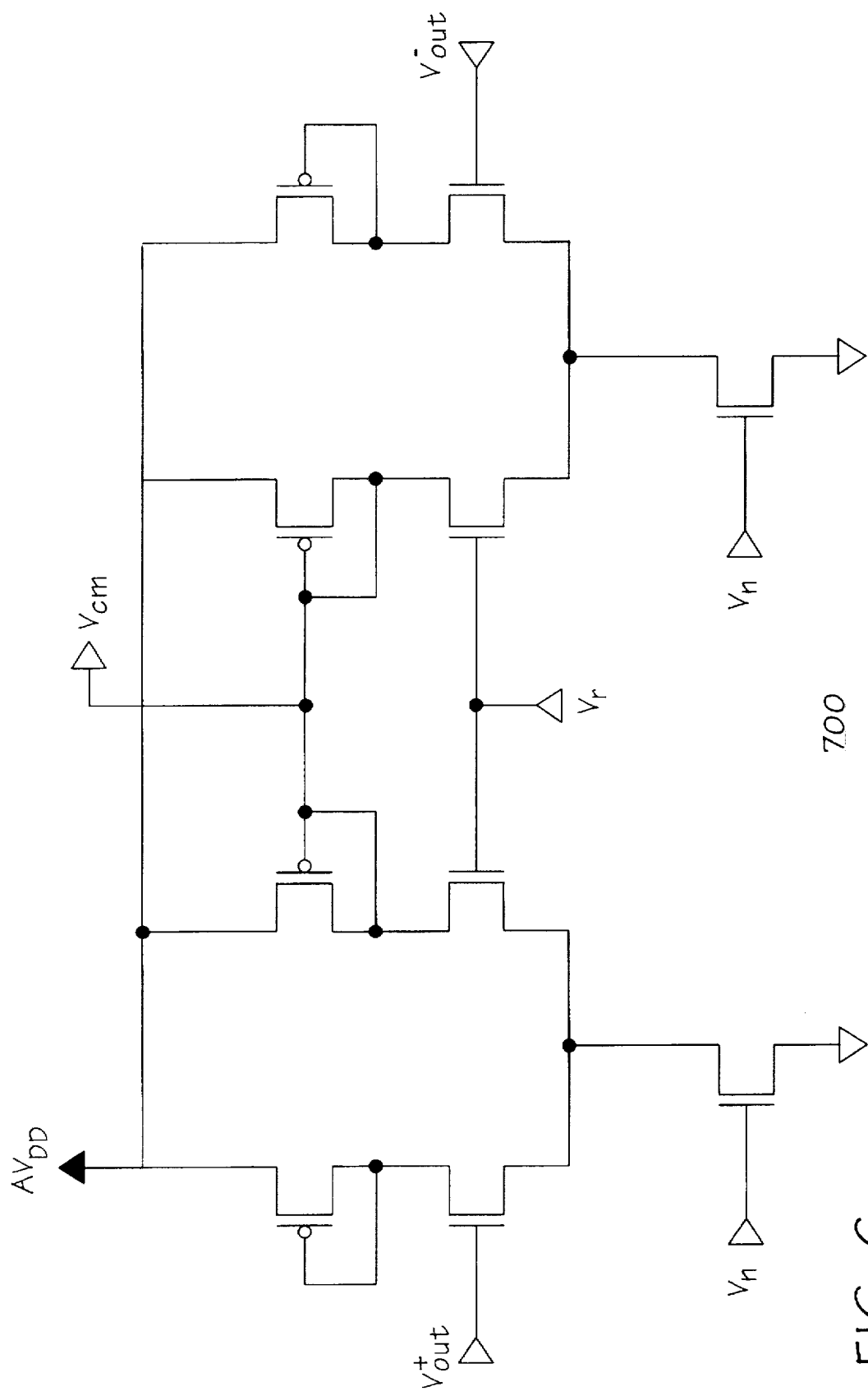
FIG. 6 illustrates one embodiment of a circuit that controls the common mode output voltage of the mixer.

As discussed above and as shown in the small AC signal equivalent circuit of the FC output stage 220 in FIG. 3, a large resistance is coupled between node 305 and the power supply voltage, $AV_{DD}$, and between node 310 and ground. Therefore, the FC output stages 220-230 require an additional circuit to stabilize the common mode output voltages $V_{FC}+$ and $V_{FC}-$. One embodiment of a circuit to stabilize the common mode output voltage is shown in FIG. 6. In a receiver application for the mixer 200, the FC output stage circuit 220 outputs the voltage, $V+_{FC}$, at an appropriate voltage level for effective use by the next circuit in the receiver. Thus, the FC output stage circuit does not require a voltage follower or source follower circuit to regulate the average voltage between the power supply voltage and ground.

In one embodiment, the gain/filter stages 240 and 250 are implemented with capacitors. As shown in FIG. 3, for the $I_{o1}$ current leg, the gain/filter stage 240 includes a capacitor 340. The voltage conversion gain of the mixer 200 is achieved by replacing the resistance, which is standard in an output stage of a MOS Gilbert cell multiplier circuit, with a capacitor. The value of the capacitor is given by the relationship:

$$C = 1/(2\pi F R)$$

where F is the intermediate frequency (IF). The capacitor 340 provides both the gain and filtering functions for the mixer 200. First, the capacitor 340 filters the upper output frequency of the mixer, (RF+LO). Second, the capacitor 340 provides the necessary gain for signals at the IF frequency. The impedance of the gain/filter stage capacitor at the IF frequency is defined by:

$$R = 1/(2\pi F C)$$

For example, if the equivalent impedance, R, is set to 10 kilo ohms (KΩ), then all of the output current, $I_{o1}$ and $I_{o2}$, from the MOS analog multiplier circuit 210 is directed to the gain/filter stages 240 and 250, respectively. Thus, the conversion gain of the mixer is effectively:

$$V_{out}/V_x = [1/(2\pi F C)] \sqrt{(2 K x K y)} \ V_y$$

where $K_x$ is the effective transconductance of the RF port, and $K_y$ is the effective transconductance of the LO port. The above calculation for the needed C to achieve an equivalent impedance R is based on the assumption of using a floating capacitor between the differential outputs $V+_{FC}$ and $V-_{FC}$. In another embodiment, instead of using a single floating capacitor, two grounded capacitors may be used; a first capacitor connected between $V+_{FC}$ and ground, and a second capacitor coupled between $V-_{FC}$ and ground. For this embodiment, the values of the grounded capacitors are doubled to achieve the desired equivalent impedance, R.

In the mixer 200, an effective 10 kilo ohm (kΩ) gain resistor is easily implemented in the gain/filter stages 240 and 250. For example, assuming that the desired intermediate frequency (IF) is 20 megahertz (MHz), then the optimal load capacitor, C, in the gain/filter stages 240 and 250 is set to the value of:

$$C = 1/[2\pi(20,000,000) \ (10,000)] = 0.8pF$$

The 0.8pF value of the capacitor in the gain/filter stages is well suited for implementation using CMOS technologies. Consequently, the conversion gain of the mixer of the present invention may be set much higher than the conversion gain achievable using a standard MOS Gilbert cell multiplier that is terminated in a pair of load resistors.

In a second example, the input RF frequency equals 320 MHz and the input LO input frequency equals 300 MHz. The (RF+LO) component at the output of the mixer is at a frequency equal to 620 MHz. At this frequency, the effective impedance of the 0.8pF capacitor is:

$$R = 1/2 * pi * F * C$$

$$R = 1/(2*pi*620,000,000*0.8*0.000,000,001)$$

$$R = 320 \text{ohms}$$

The effective impedance using the same capacitor at the (RF–LO) frequency of 20 MHz is 10 kilo ohms. Thus for this particular example, the conversion gain of the mixer at the (R +LO) frequency is smaller than the conversion gain at the (RF–LO) frequency by a factor of 10,000/320≈30. Therefore, the gain/filter stage 240 effectively filters out, or attenuates, the RF+LO component.

Figure 4:
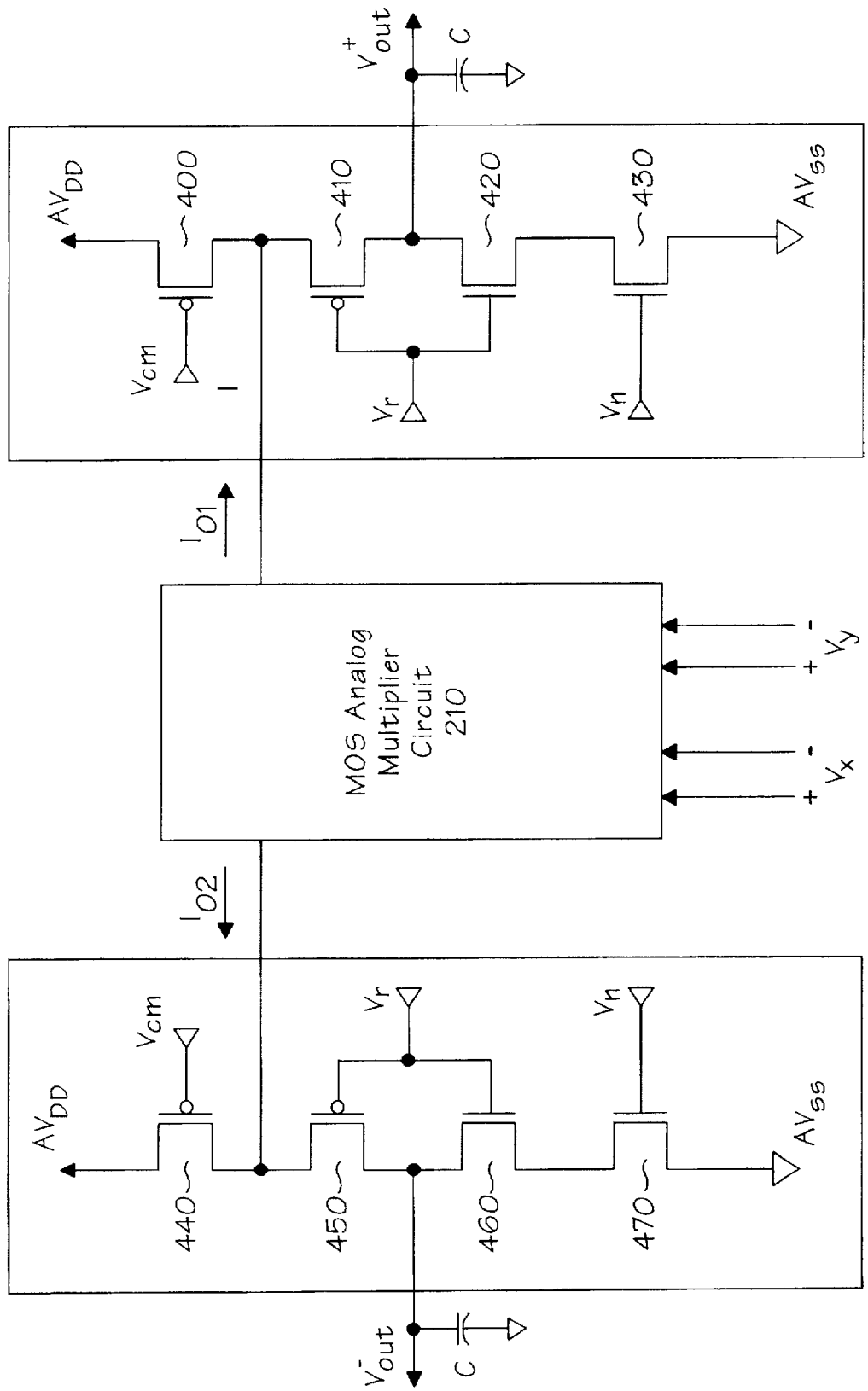
FIG. 4 illustrates the folded-cascode embodiment for the output stages of the present invention.

FIG. 4 illustrates the folded-cascode embodiment of the output stages for the mixer of the present invention. As shown in FIG. 4, the output stages 220 and 230 are implemented with a plurality of n channel and p channel metal oxide semiconductor (MOS) transistors. Specifically, the output stage 220 includes p channel transistors 400 and 410 and n channel transistors 420 and 430. Similarly, the output stage 230 includes p channel transistors 440 and 450 and n channel transistors 460 and 470. The source of p channel transistors 400 and 440 is connected to the power supply voltage, $AV_{DD}$, and the source of n channel transistors 430 and 470 is connected to ground. The p channel transistors 400 and 440 receive a common mode control voltage, $V_{cm}$, at the gate of each transistor. The gates of p channel transistor 410 and n channel transistor 420 are biased by a fixed voltage, $V_r$. In one embodiment, the voltage $V_r$ is set to approximately one-half the power supply voltage (i.e., $V_r = AV_{DD}/2$). Also, the n channel transistors 430 and 470 receive a constant voltage, $V_n$, at their respective gates. The exact value of the control voltage, $V_n$, is secondary when implementing the circuit in CMOS. Instead, for the CMOS implementation, the current through transistors 430 and 470 is controlled, typically through use of current-mirroring techniques.

In operation, transistor pair 430 and 420, as well as transistor pair 470 and 460, constitute cascode current sources with a very high output impedance, $R_{o2}$ (430, 420), $R_{o4}$ (470, 460). Transistor pair 400 and 410 and transistor pair 440 and 450 also exhibit very high output impedances $R_{o1}$ (400, 410) and $R_{o3}$ (440, 450) respectively. In general, the definition of very high output impedance is defined for signal frequencies of interest such that:

$$R_{o1} \ (400,410) > 1/scl$$

$$R_{o2} \ (430,420) > 1/scl$$

Thus, when the current from the MOS analog circuit 210, $I_{o1}$, enters the output stage 220, a high impedance is generated at the drain of p channel transistor 400. The source of p channel transistor 410 provides a low resistance path for the $I_{o1}$ current. The cascoded n channel transistors 420 and 430 form a second cascoded current source towards ground, $AV_{SS}$. All of the signal current, $I_{o1}$, is directed from the drain of p channel transistor 410 to the capacitor C due to the high impedance at the drain of n channel transistor 420. The operation of the output stage 230 is analogous to the operation of the output stage 220.

Figure 5:
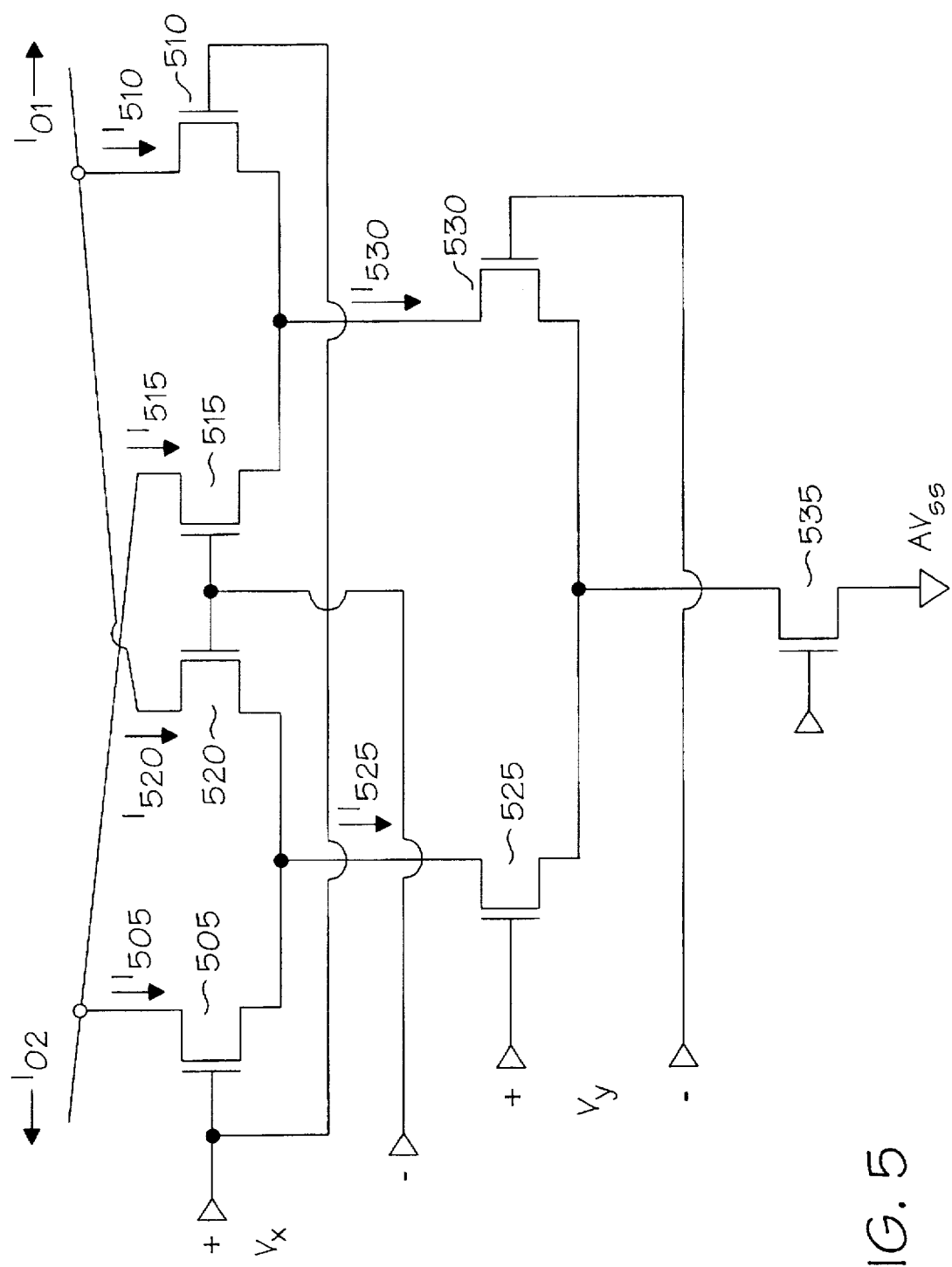
FIG. 5 illustrates one embodiment for the MOS analog multiplier circuit of the present invention.

FIG. 5 illustrates one embodiment for the MOS analog multiplier circuit of the present invention. As shown in FIG. 5, the MOS analog multiplier circuit 500 is configured as a Gilbert multiplier cell without gain resistors (i.e. there are no gain resistors connected to the power supply voltage, $AV_{DD}$, as in the Gilbert cell configuration of FIG. 1). The MOS analog multiplier circuit 500 includes a plurality of n channel transistors. As shown in FIG. 5, the Gilbert multiplier cell includes n channel transistors 505, 510, 515, 520, 525, 530, and 535. In one embodiment, the MOS analog multiplier circuit 210 contains low threshold n channel transistors, except for n channel transistor 535. Although standard transistors may be used to construct the analog multiplier circuit 500, the standard transistors increase the width/length channel ratio, thereby increasing the input capacitance of the circuit.

The following analysis of the Gilbert multiplier cell assumes ideal behavior of the n channel transistors, and that the n channel transistors are biased in the saturation region. Defining the output currents $I_{o2}=-(I_{505}+I_{515})$ and $I_{o1}=-(I_{520}+I_{510})$, then the differential output current, $I_{o2}-I_{o1}$, is calculated as (S.C. Qin and R. L. Geiger):

$$I_{o2} - I_{o1} = \sqrt{2K_a}\ V_x \left[ \sqrt{I_{525}} \sqrt{1 - \frac{K_a V_x^2}{2I_{525}}} - \sqrt{I_{530}} \sqrt{1 - \frac{K_a V_x^2}{2I_{530}}} \right]$$

If $$\frac{K_a V_x^2}{2I_{525}} < 1$$

and $$\frac{K_a V_x^2}{2I_{530}} < 1$$

the differential current $I_{o2}-I_{o1}$ reduces to $$I_{o2} - I_{o1} = \sqrt{2K_a K_b}\ V_x V_y$$

The prior art conversion gain equation, $V_o/V_x$, is obtained through multiplication of $I_{o1}-I_{o2}$ by the load resistance, R.

In one embodiment, a circuit may be utilized to stabilize the common mode output voltage. FIG. 6 illustrates one embodiment of a circuit that controls the common mode output voltage of the mixer. As shown in FIG. 4, and as discussed above, the p channel transistors 400 and 440 in the folded-cascode circuit receive a control voltage, $V_{cm}$. In general, the circuit 700 senses the common mode output voltage, $(0.5\times(V^+_{out}+V^-_{out}))$, and it generates, in return, a biasing voltage, $V_{cm}$. The control voltage, $V_{cm}$, is used to bias transistors 400 and 440. The feedback provided by $V_{cm}$, and input into the folded-cascode stage, stabilizes the common mode output voltage at an intermediate point between the power supply voltage, $AV_{DD}$, and ground, $AV_{ss}$. The precise value of the stabilized common mode output voltage is determined by the value assigned to the bias voltage $V_r$ in FIG. 6. Typically, the value of $V_r$ is set to some midpoint value near $AV_{DD}/2$.

In operation, if a factor of the circuit causes the output voltage, $V^+_{out}$ and $V^-_{out}$ to drift toward ground, $AV_{ss}$, or to the power supply voltage, $AV_{DD}$, then the $V_{cm}$ voltage introduced by the common mode circuit of FIG. 6 drives the common mode output voltage of the folded-cascode stage in the opposite direction (i.e. towards the power supply voltage, $AV_{dd}$, if the voltage drifts down and to ground, $AV_{ss}$, if the voltage drifts up). Thus, the circuit 700 provides a precise definition of the common mode output voltage for the folded-cascode output stages 220 and 230. Other circuits may be used, instead of circuit 700, to stabilize the common mode output voltage of the output stages 220 and 230.

Figure 7:
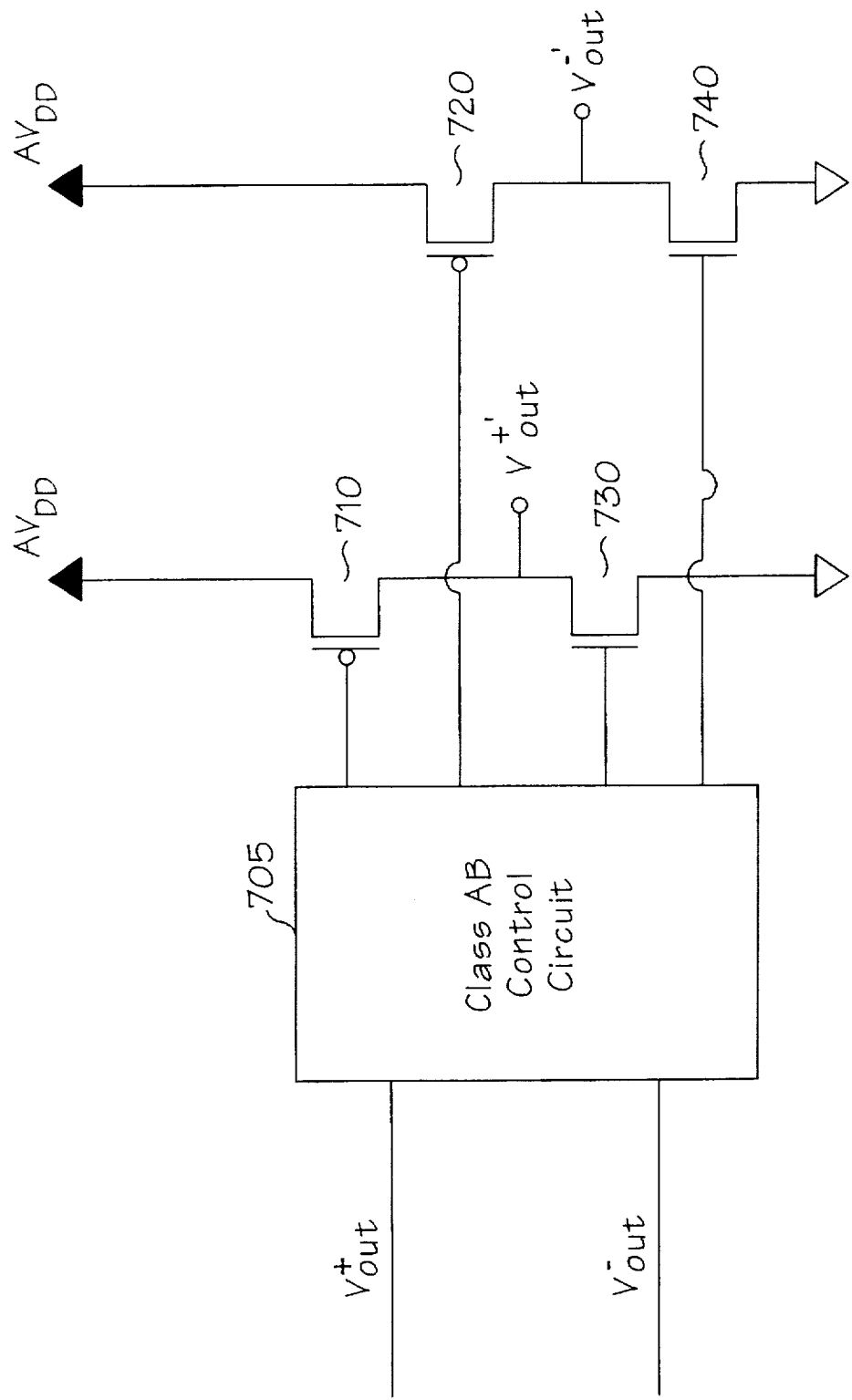
FIG. 7 illustrates a circuit to increase the output swing of a MOS mixer.

If needed, the output swing of the folded-cascode stage of the mixer may be increased using well known techniques (see, for example, Satoshi Sakurai and Mohammed Ismail, "Low-voltage CMOS Operational Amplifiers", Kluwer Academic Publishers, pages 71–87). FIG. 7 illustrates a typical circuit that follows the Folded-Cascode stage, to increase the output voltage swing. The differential output voltage, $V^+_{out}$ and $V^-_{out}$, control a class AB control circuit, labeled 705 in FIG. 7. This circuit, in turn, controls p channel transistors 710 and 720, and n channel transistors 730 and 740. The output nodes $V^+_{out}$ and $V^-_{out}$ swing within one saturation voltage of the rails.

Figure 8:
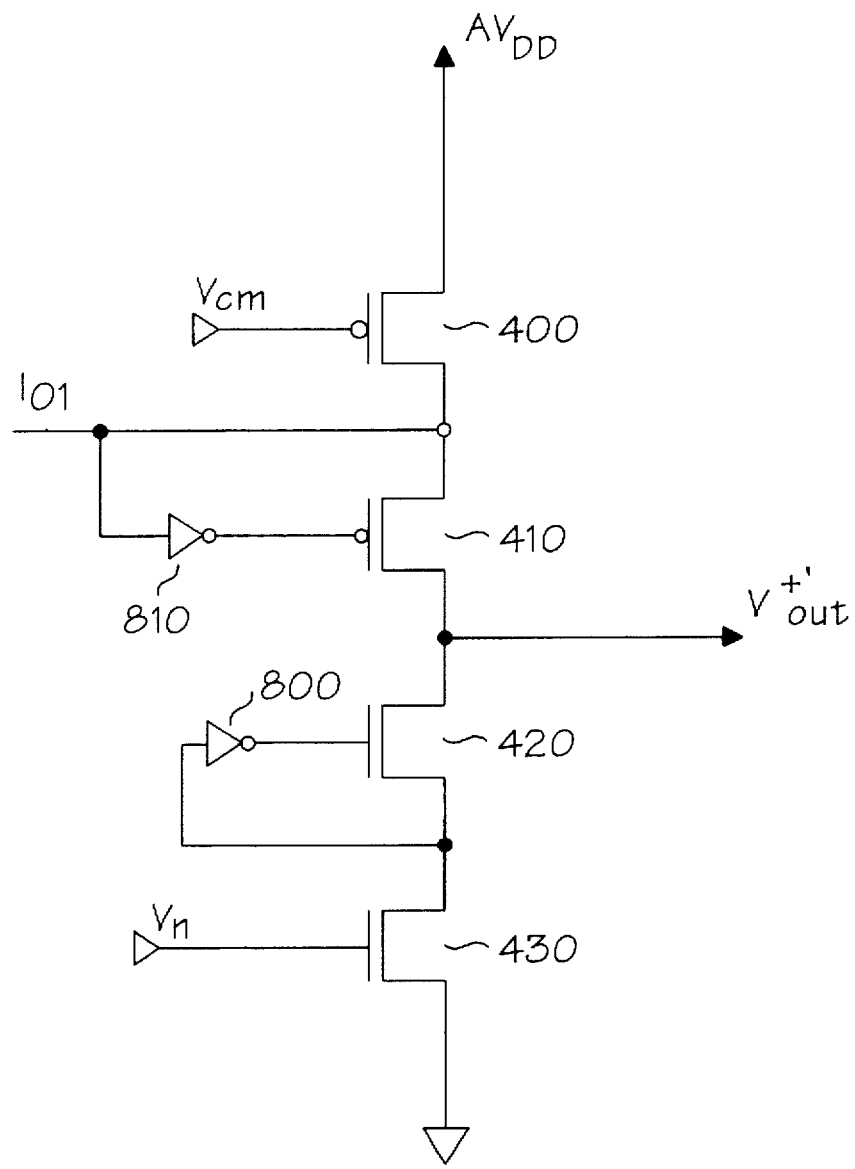
FIG. 8 illustrates a cascoded current source circuit with active feedback.

FIG. 8 illustrates a cascoded current source circuit with active feedback. As shown in FIG. 8, for the current source on the FC output stage 220, an inverting amplifier 800 is coupled between the source of n channel transistor 420 to control its gate. An inverting amplifier 810 is coupled between the source and the gate of p channel transistor 410 to control its gate. A cascode current source with active feedback has an output resistance much larger than an output resistance obtained with a simple cascode current source. (See Jaime E. Kardontchik, "Introduction to the Design of Transconductor-Capacitor Filters, Kluwer Academic Publishers, pages 164–167). Thus, the higher output resistance exhibited by the cascode current source with active feedback as shown in FIG. 8 optimizes the FC output stages 220 and 230, and it insures all signal current, $I_{o1}$ and $I_{o2}$, is output to the gain/filter stages 240 and 250, respectively.

For the mixer of the present invention, a net conversion gain is easily achievable over different input RF signal voltages. For example, in one embodiment, if the input RF waveform is 100 millivolts (mV), then the achievable output amplitude of the IF waveform is approximately 130 millivolts (mV). The same $V_{out}/V_x$ ratios are obtained when lower amplitudes are input to the RF ports of the mixer. The gain of the mixer may further be increased either by increasing the effective impedance of the gain/filter stages 240 and 250 at the IF frequency or by increasing the transconductance constants, $K_x$ and $K_y$. As discussed above, for the embodiment utilizing a capacitor for the gain/filter stages 240 and 250, the effective impedance is increased by using a smaller capacitor. The increase of the transconductance constants, $K_x$ and $K_y$, may be accomplished through use of larger input transistors (e.g. transistors that are constructed with a larger width/length channel ratio). However, as discussed above, an increase in the aspect ratio of the channels in the input transistors increases the capacitive input load of the mixer.

The following example illustrates the conversion gain of the mixer in logarithmic (dB) units. Assuming identical input and output impedances, the conversion gain is defined by the relationship:

$$\text{conversion gain} = 10\log[(V_{out}/V_x)^2]$$

For the above example, with $V_x$ equal to 100 millivolts (mV), and $V_o$ equal to 130 millivolts (mV), an equivalent conversion gain of 2.4 dB is obtained if the amplitude of the LO input is fixed at 200 millivolts (mV). If the LO input is terminated in a 50 ohm resistor, then the input LO power, in dBm units, is defined by the relationship:

$$10\log\frac{0.5|V^2|/R}{1mW}$$

and $$10\log\frac{0.5[(0.2)^2]/50}{0.001} = -4\ \text{dBm (LO input)}$$

Similarly, assuming a 50 ohm input impedance at the RF port, the corresponding input level of the RF signal is, for a 100 mV input on the RF port:

$$10 \log \frac{0.5[(0.1)^2]/50}{0.001} = -10 \text{ dBm } (RF \text{ input})$$

For this example, the total current dissipation was 1.4 milli amps, and the power supply voltage was 2.7 volts.

Figure 9:
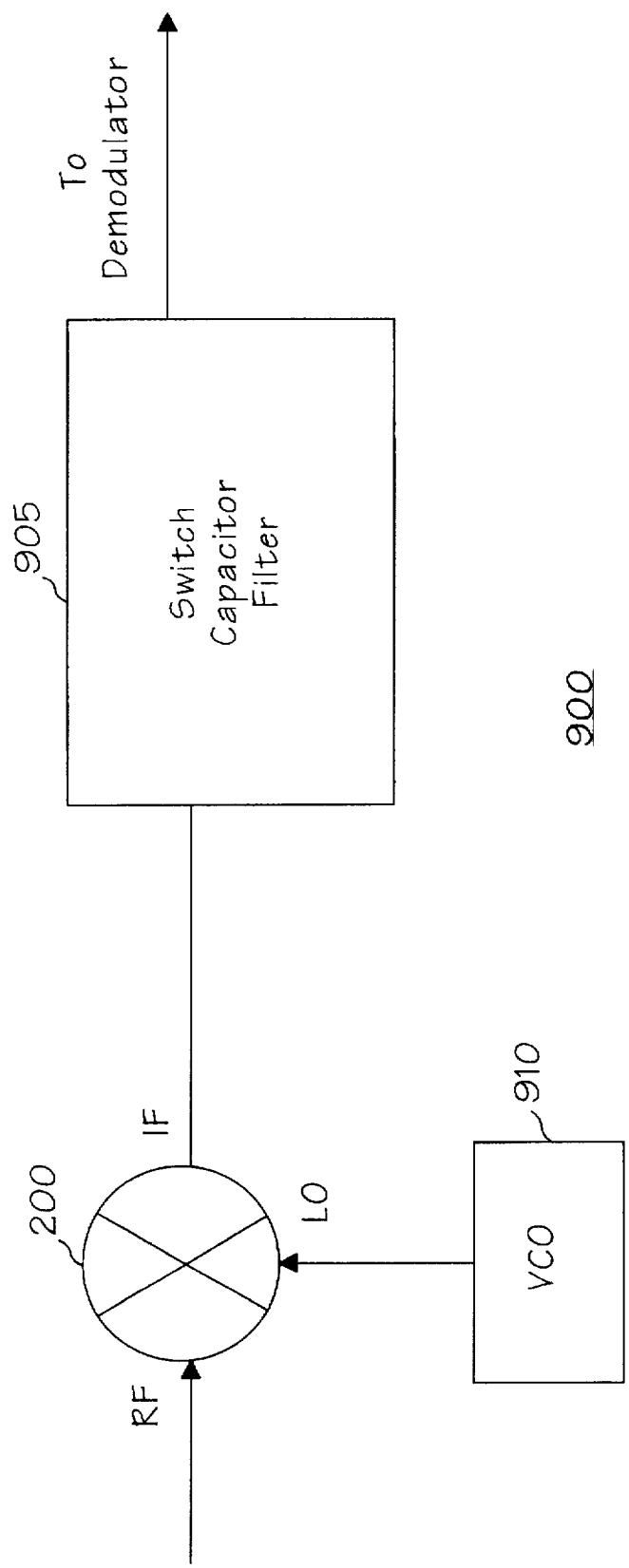
FIG. 9 is a block diagram illustrating a receiver including the mixer of the present invention.

FIG. 9 is a block diagram illustrating a receiver including the mixer of the present invention. The receiver 900 includes the mixer 200, a switch capacitor filter 905, a voltage controlled oscillator (VCO) 910. In another application, the switched-capacitor filter may be replaced, for example, by an Oversampled Delta-Sigma Analog to Digital Converter. The mixer 200 receives the radio frequency (RF) signals from an external source, such as an antenna preamplifier. The VCO 910 generates a voltage, at a mixing frequency, for input to the mixer 200 at the LO port. The mixer 200 generates the output intermediate frequency (IF) for input to the switch capacitor filter 905. In general, the switch capacitor filter 905 attenuates undesired signals at mixer 200, and it attenuates undesired signals at frequencies near the desired (RF–LO) frequency. The input impedance of the switch capacitor filter 905 is essentially a capacitive load. The mixer 200, with the FC output stages 220 and 230, is suitable for driving a capacitive load. For a receiver implemented on an integrated circuit utilizing, for example, CMOS technology, the mixer 200 of the present invention is suitable for output to a capacitive load, such as a switch capacitor filter. Thus, the mixer 200 of the present invention has application for integrating a receiver on a single integrated circuit chip.

Although the present invention has been described in terms of specific exemplary embodiments, it will be appreciated that various modifications and alterations might be made by those skilled in the art without departing from the spirit and scope of the invention as set forth in the following claims.

What is claimed is:

1. A mixer comprising:
    a multiplier circuit comprising a plurality of transistors configured to receive a differential radio frequency (RF) signal and a differential local oscillator (LO) signal and to generate a differential intermediate frequency (IF) signal in accordance with mixing said RF signal and said LO signal;
    an output stage circuit coupled to receive a differential current of said differential IF signal, said output stage comprising a low input impedance and a high output impedance for generating an output stage differential current approximately equal to said differential current from said IF differential signal; and
    a gain stage coupled to said output stage for controlling conversion gain of said differential IF signal.

2. The mixer circuit as set forth in claim 1, wherein said mixer comprises a downconverter mixer and said gain stage further comprises a filter for filtering high frequency components generated by said multiplier circuit.

3. The mixer circuit as set forth in claim 1, wherein said output stage circuit comprises a folded-cascode circuit.

4. The mixer circuit as set forth in claim 3, wherein said folded-cascode circuit further comprises an active feedback circuit.

5. The mixer circuit as set forth in claim 3, further comprising a common mode voltage circuit, coupled to said folded-cascode circuit, for controlling said folded-cascode circuit for common mode voltage at said differential IF signal.

6. The mixer circuit as set forth in claim 1, wherein said gain stage comprises a capacitor.

7. The mixer circuit as set forth in claim 1, wherein said transistors comprise metal oxide semiconductor (MOS) transistors including a drain, a source and a gate, wherein:
    a first transistor and a second transistor are coupled, at each drain, to a first node and a second node, respectively, and said first and said second transistors receive, at each gate, a positive leg of said RF differential signal;
    a third transistor and a fourth transistor are coupled, at each drain, to said second node and said first node, respectively, and said third and said fourth transistors receive, at each gate, a negative leg of said RF differential signal, said first and third transistors being coupled at the sources, and said second and fourth transistors being coupled at each source;
    a fifth transistor and sixth transistor, a drain of said fifth transistor being coupled to said sources of said first and third transistors and a drain of said sixth transistor being coupled to said sources of said second and fourth transistors, said fifth transistor receiving, at its gate, a positive leg of said LO differential signal, and said sixth transistor receiving, at its gate, a negative leg of said LO differential signal, and said fifth and sixth transistors being coupled at each source;
    a current source coupled at said sources of said fifth and sixth transistors and coupled to ground.

8. The mixer circuit as set forth in claim 1, further comprising a stage circuit to increase output swing of said output voltage.

9. A mixer comprising:
    a multiplier circuit comprising:
    a first set of metal oxide semiconductor (MOS) transistors coupled to receive, at their gates, a radio frequency (RF) differential voltage signal and coupled, at their drains, to a first and second node;
    a second set of (MOS) transistors coupled to said first set of transistors and coupled to receive a local oscillator (LO) differential voltage, and to generate a differential intermediate frequency (IF) signal, including a differential current, in accordance with mixing said RF signal and said LO signal;
    a constant current source coupled to said second set of transistors and ground;
    an output folded-cascode stage coupled directly to said first and second nodes to receive said differential IF signal, said output stage comprising a low input impedance and a high output impedance, and said output stage for generating an output stage differential current approximately equal to said differential current from said IF differential signal; and
    a gain stage coupled to said output stage for controlling conversion gain of said output stage differential current.

10. The mixer circuit as set forth in claim 9, wherein said mixer comprises a downconverter mixer and said gain stage further comprises a filtering characteristic for filtering high frequency components generated by said multiplier circuit.

11. The mixer circuit as se t forth in claim 9, wherein said folded-cascode circuit further comprises an active feedback circuit.

12. The mixer circuit as set forth in claim 9, further comprising a common mode voltage circuit, coupled to said folded-cascode circuit, for controlling said folded-cascode circuit for common mode voltage at said differential current output.

13. The mixer circuit as set forth in claim 9, wherein said gain stage comprises a capacitor.

14. The mixer circuit as set forth in claim 9, further comprising an additional stage circuit to increase output swing of said output voltage.

15. The mixer circuit as set forth in claim 9, wherein:

said first set of MOS transistors comprise first, second, third, and fourth transistors, said first transistor and said second transistor are coupled, at each drain, to said first node and said second node, respectively, and said first and said second transistors receive, at each gate, a positive leg of said RF differential signal, said third transistor and said fourth transistor are coupled, at each drain, to said second node and said first node, respectively, and said third and said fourth transistors receive, at each gate, a negative leg of said RF differential signal, said first and third transistors being coupled at the sources, and said second and fourth transistors being coupled at each source;

said second set of transistors comprise a fifth transistor and sixth transistor, a drain of said fifth transistor being coupled to said sources of said first and third transistors and a drain of said sixth transistor being coupled to said sources of said second and fourth transistors, said fifth transistor receiving, at its gate, a positive leg of said LO differential signal, and said sixth transistor receiving, at its gate, a negative leg of said LO differential signal, and said fifth and sixth transistors being coupled at each source.

16. A downconverter mixer comprising:

a multiplier circuit comprising a plurality of transistors configured to receive a differential radio frequency (RF) signal and a differential local oscillator (LO) signal and to generate, at a first and second node, a differential intermediate frequency (IF) signal in accordance with mixing said RF signal and said LO signal, said transistors comprising:

a first transistor and a second transistor coupled, at each drain, to said first node and said second node, respectively, and said first and said second transistors receive, at each gate, a positive leg of said radio frequency (RF) differential signal;

a third transistor and a fourth transistor coupled, at each drain, to said second node and said first node, respectively, and said third and said fourth transistors receive, at each gate, a negative leg of said RF differential signal, said first and third transistors being coupled at the sources, and said second and fourth transistors being coupled at each source;

a fifth transistor and sixth transistor, a drain of said fifth transistor being coupled to said sources of said first and third transistors and a drain of said sixth transistor being coupled to said sources of said second and fourth transistors, said fifth transistor receiving, at its gate, a positive leg of said LO differential signal, and said sixth transistor receiving, at its gate, a negative leg of said LO differential signal, and said fifth and sixth transistors being coupled at each source;

a current source coupled at said sources of said fifth and sixth transistors and coupled to ground;

a folded-cascode output stage coupled to said first and second nodes to receive said differential IF signal, said output stage comprising a low input impedance and a high output impedance, and said output stage generating an output stage differential current approximately equal to said differential current from said IF differential signal; and a capacitor coupled across said output stage for controlling conversion gain of said differential IF signal and for filtering high frequency components generated by said multiplier circuit.

17. The downconverter mixer circuit as set forth in claim 16, wherein said folded-cascode circuit further comprises an active feedback circuit.

18. The downconverter mixer circuit as set forth in claim 16, further comprising a common mode voltage circuit, coupled to said folded-cascode circuit, for controlling said folded-cascode circuit for common mode voltage at said IF differential output.

19. The downconverter mixer circuit as set forth in claim 16, further comprising a circuit to increase output swing of said output.

* * * * *